United States Patent
Chang (10) Patent No.: US 7,839,706 B2
(45) Date of Patent: Nov. 23, 2010

(54) DUAL MODE ACCESSING SIGNAL CONTROL APPARATUS AND DUAL MODE TIMING SIGNAL GENERATING APPARATUS

(75) Inventor: Meng-Fan Chang, Taipei (TW)

(73) Assignee: National Tsing Hua University, Hsinchu (TW)

( * ) Notice: Subject to any disclaimer, the term of this patent is extended or adjusted under 35 U.S.C. 154(b) by 70 days.

(21) Appl. No.: 12/403,860

(22) Filed: Mar. 13, 2009

(65) Prior Publication Data

US 2009/0273994 A1 Nov. 5, 2009

(30) Foreign Application Priority Data

May 5, 2008 (TW) .............................. 97116438 A (51) Int. Cl.
*G11C 7/00* (2006.01)
*G11C 7/02* (2006.01)
(52) U.S. Cl. ...................... 365/194; 365/191; 365/210.1
(58) Field of Classification Search .................. 365/194
See application file for complete search history.

(56) References Cited

U.S. PATENT DOCUMENTS 6,208,563 B1 * 3/2001 Naritake ................. 365/189.05
7,120,045 B2 * 10/2006 Lee et al. ..................... 365/145
7,656,733 B2 * 2/2010 Shinozaki et al. ......... 365/210.1

OTHER PUBLICATIONS

Chang, et al., "Improving the Speed and Power of Compilable SRAM using Dual-Mode Self-Timed Technique", Dec. 2007 (4 pages).

* cited by examiner

*Primary Examiner*—Son L Mai
(74) *Attorney, Agent, or Firm*—Holland & Knight LLP; Brian J. Colandreo, Esq (57) ABSTRACT

A dual mode accessing signal control apparatus for being used in a dummy cells set of a memory, and a dual mode timing signal generating apparatus comprising a dual mode accessing signal control apparatus are provided. The dual mode accessing signal control apparatus respectively generates a write delay signal and a read signal during the write and the read process. The memory is thereby capable of self-timing its write and the read process, and is able to generate a wordline signal with a shorter width in the write process to ensure an early start to precharging. As a result, the whole duty period of the memory can be shortened.

17 Claims, 8 Drawing Sheets

DUAL MODE ACCESSING SIGNAL CONTROL APPARATUS AND DUAL MODE TIMING SIGNAL GENERATING APPARATUS

RELATED APPLICATION

This application claims priority to Taiwan Patent Application No. 097116438 filed on 5 May 2008, the disclosure of which is incorporated herein by reference in its entirety.

BACKGROUND OF THE INVENTION

1. Field of the Invention

The present invention relates to a dual mode accessing signal control apparatus for use in a memory and a dual mode timing signal generating apparatus. More particularly, the present invention relates to a dual mode accessing signal control apparatus capable of generating a shorter wordline width during a write process and a dual mode timing signal generating apparatus.

2. Descriptions of the Related Art

The most frequently used bitline tracking schemes of conventional static random access memories (SRAMs) are timing signal generating circuits. This bitline tracking scheme consists of a plurality of wordlines and a plurality of bitlines for use in a read process and a write process. The wordlines and bitlines intersect each other to form a plurality of memory cells. Generally, during the read process of the SRAM, the pulses on the wordlines must be of a sufficient width, so that a slight voltage swing is generated on the bitline signal and then a sense amplifier is used to correctly sense the data stored in the memory cells. In contrast, during the write process of the SRAM, the bitline voltage is decreased to the ground (GND) level. Finally, when the wordline pulse begins to fall, the bitline is precharged back to the VDD level. As a consequence, the whole cycle time of the read process and the write process are extended, which is especially the case when the memory capacity is relatively large.

Figure 1A:
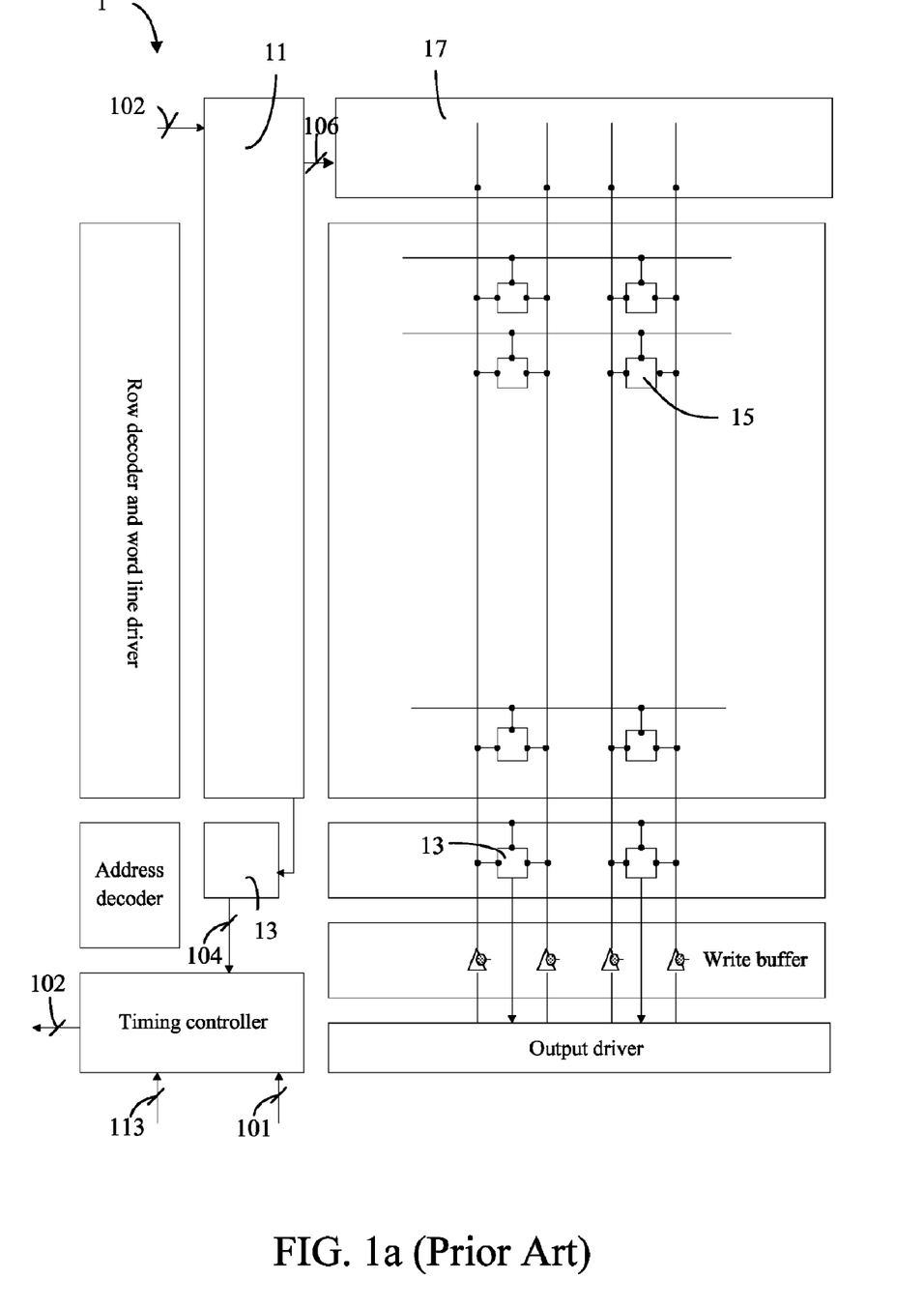
FIG. 1a is a schematic view of a conventional SRAM scheme.
Figure 1B:
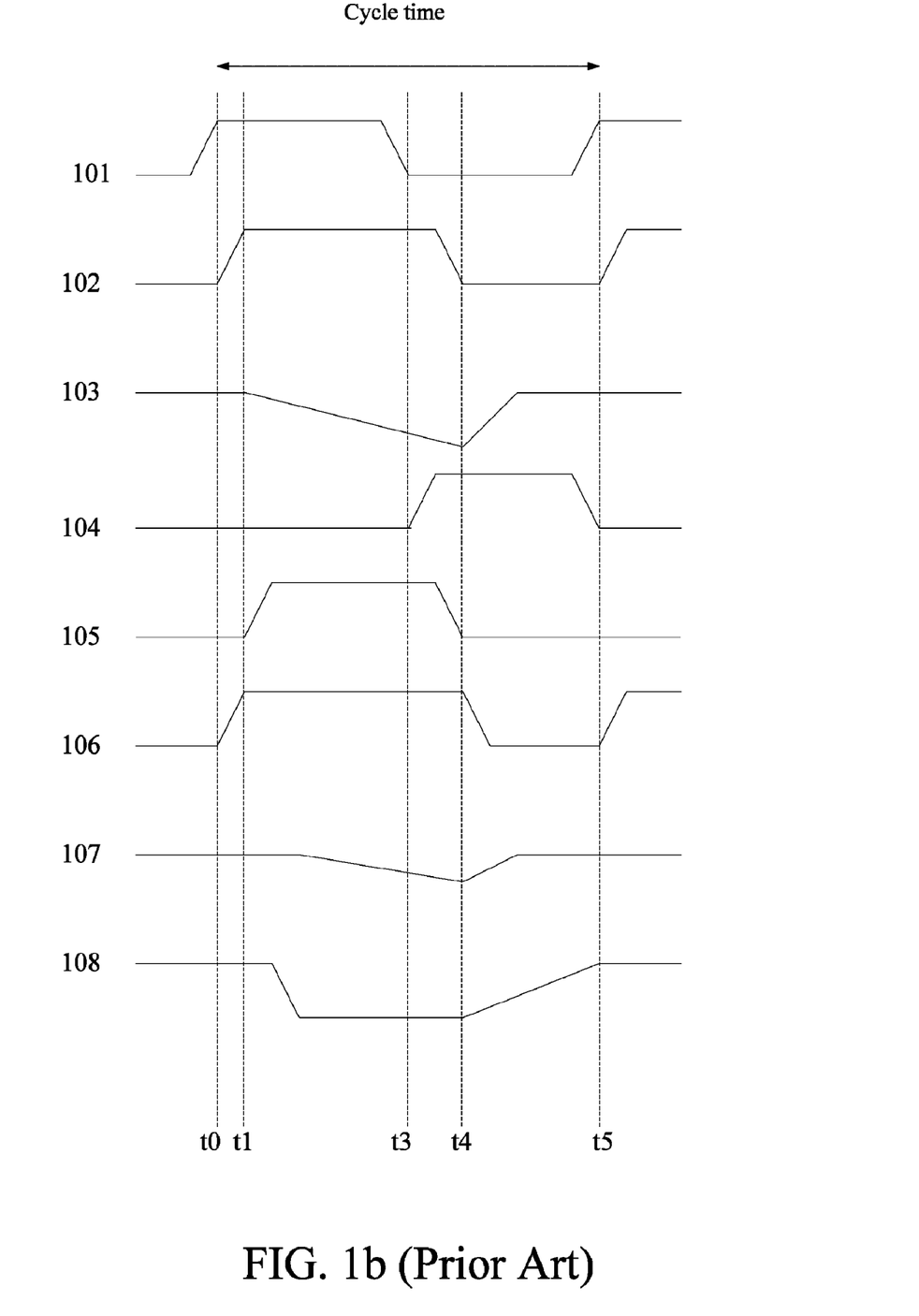
FIG. 1b depicts the timing signal waveforms of a dummy column in the conventional SRAM scheme.

FIGS. 1a and 1b depict a schematic view of a conventional SRAM scheme and the timing signal waveforms of a dummy column thereof respectively. For the circuit blocks that are not essentially related to the following description, the designations thereof are labeled in FIG. 1a directly for ease of understanding. At time t0, when a write actuating signal 113 is in an accessible state, a clock signal (CLK) 101 triggers a pulse start signal 102 to rise. The pulse start signal 102 reaches the highest level at time t1 to activate a dummy bitlines (DBLs) in the dummy column 11 so that a dummy bitline signal 103 begins to decrease while a wordline (WL) signal 105 begins to rise. At time t3, a dual-mode voltage detector 13 determines that the dummy bitline signal 103 is lower than a reference value, and then generates a pulse end signal 104. The pulse end signal 104 then pulls down the wordline signal 105 which previously stays at a high voltage level.

Furthermore, when being pulled down during the read process (i.e., between time t3 and t4), the wordline signal 105 has a width adapted to cause a slight voltage swing of about 200 mv on a bitline signal 107. A sense amplifier 13 then correctly senses data stored in the memory cells 15. Once the wordline signal 105 comes to an end at time t4, the precharging signal 106 begins to decrease while the bitline signal 107 of the read process starts precharging gradually, as depicted in FIG. 1b.

However, during the write process, a bitline signal 108 of the write process stays at the GND level while the wordline signal 105 stays at a high voltage level. This continues until the wordline signal 105 comes to an end at time t4 when the bitline signal 108 begins to be precharged. As a result, it takes a long time for the bitline signal 108 to be restored to the high voltage level as depicted in FIG. 1b, which leads to a prolonged cycle time of the SRAM.

Accordingly, to solve the aforesaid problem, a solution in which different timing signals are provided in the read process and the write process respectively has been proposed in the prior art to shorten the cycle time. For example, U.S. Pat. No. 6,643,204 disclosed "a self-time scheme to reduce cycle time for memories". According to this scheme, a cycle time delay of a wordline decoder, a cycle time delay of a dummy wordline relative to a dummy write cell, and a response time of the dummy write cell are utilized to detect the end of the write process to shorten the cycle time of the SRAM.

Another example is "a fast read/write cycle memory device having a self-timed read/write control circuit" as disclosed by U.S. Pat. No. 6,392,957. This patent is characterized by its read reference column and write reference column that are used to detect time points at which a read cycle and a write cycle end respectively. Two sense amplifiers are used to sense the end of the operations of the read reference columns according to a write-process-complete logic. In addition, a multiplexer is used to select outputs of the two sense amplifiers, while the sense amplifiers senses the operations of the read reference column according to the write process to determine a time point at which the read process ends. By controlling the dummy memory cells with a dummy wordline, the data rewrite operations of the write process are simulated and a complete signal is sent out to end the write process.

According to the disclosures of the aforesaid U.S. Pat. No. 6,643,204 and U.S. Pat. No. 6,392,957, although the read cycle time and the write cycle time can be shortened, the dummy write cell disclosed in U.S. Pat. No. 6,643,204 and the dummy memory cell disclosed in U.S. Pat. No. 6,392,957 can only reflect an average value of the write cycle time of the memory cells but fail to reflect the longest write cycle time. Consequently, it is impossible for the memory cells to sense the data stored therein in a quite correct way. Moreover, the invention disclosed in U.S. Pat. No. 6,392,957 requires too large of a chip area, which is impractical in application.

In view of this, it is important to read or write data in a quick and correct way to shorten the cycle time of a memory and reduce the area of a chip while still ensuring good performance thereof.

SUMMARY OF THE INVENTION

One objective of this invention is to provide a dual mode accessing signal control apparatus for a dummy cells set of a memory. The dual mode accessing signal control apparatus generates a write delay signal adapted to make the dummy cells set generate a first voltage decrease lower than a reference value to enable the memory to start a write process. The write delay signal is also adapted to make the dummy cells set generate a first end indication signal after a first time interval to enable the memory to end the write process. The dual mode accessing signal control apparatus generates a read signal adapted to make the dummy cells set generate a second voltage decrease lower than the reference value, thereby to enable the memory to start a read process. The read signal is also adapted to make the dummy cells set generate a second end indication signal after a second time interval to enable the memory to end the read process. As a result, by enabling the memory to generate timing signals for the write process and the read process, the dual mode accessing signal control apparatus can be used in the memories with a self-timing function to adjust the timing of the write process and the read process. In addition, a wordline signal of a shorter width can be obtained during the write process to shorten the cycle time of the random accessing operations of the memories.

The dual mode accessing signal control apparatus of this invention comprises a write delay circuit and an activating circuit. The write delay circuit is configured to receive an actuating signal and a pulse start signal and generate a write delay signal to the dummy cells set after the pulse start signal transits to an accessible state and the actuating signal transits to a writable state. The write delay circuit is further configured to provide an adjustable delay time on the write delay signal for various process conditions. The activating circuit is configured to receive the actuating signal and the pulse start signal and generate a read signal to the dummy cells set after the pulse start signal transits to an accessible state and the actuating signal transits to a readable state.

Another objective of this invention is to provide a dual mode timing signal generating apparatus for use in a memory. This dual mode timing signal generating apparatus allows both the write process and the read process to simulate the read and write operations of bitlines and wordlines of a plurality of memory cells in the memory on a dummy bitline. Hence, this invention is applicable to a memory with only a dummy column to execute the write process and the read process on the dummy bitline in the dummy column. This not only saves the use of the chip area, but also makes it easier for the timing controller to control the write and read operations even with the inconsistent discharging times of the bitlines of multiple memory cells incurred by varied temperatures and voltages.

The dual mode timing signal generating apparatus of this invention comprises a dual mode accessing signal control apparatus, a dummy column and a dual-mode voltage detector. The dual mode accessing signal control apparatus is configured to receive an actuating signal and a pulse start signal and to generate a write delay signal and a read signal in response to the reception of the actuating signal and the pulse start signal respectively. The dummy column is configured to generate a first voltage decrease and a second voltage decrease on the dummy bitline of the dummy column in response to the reception of the write delay signal and the read signal respectively. The dual-mode voltage detector is configured to make the memory start the write process in response to the first voltage decrease that is lower than the reference value and to generate a first end signal to enable the memory to end the write process after a first time interval. The dual-mode voltage detector is configured to make the memory start the read process in response to the second voltage decrease that is lower than the reference value and to generate a second end signal to enable the memory to end the read process after a second time interval. Furthermore, the write delay signal ensures that the voltage level of the wordline signal in the memory will not drop until the first voltage decrease is lower than a reference value, especially for the write process, thereby to reduce the width of the wordline signal.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

In the following description, this invention will be explained with reference to embodiments thereof. However, these embodiments are not intended to limit this invention to any specific context, application or particular implementation described in these embodiments. Therefore, these embodiments are described only for purposes of illustration but not limitation. It should be appreciated that in the following embodiments and attached drawings, elements unrelated to this invention are omitted from depiction.

Figure 2:
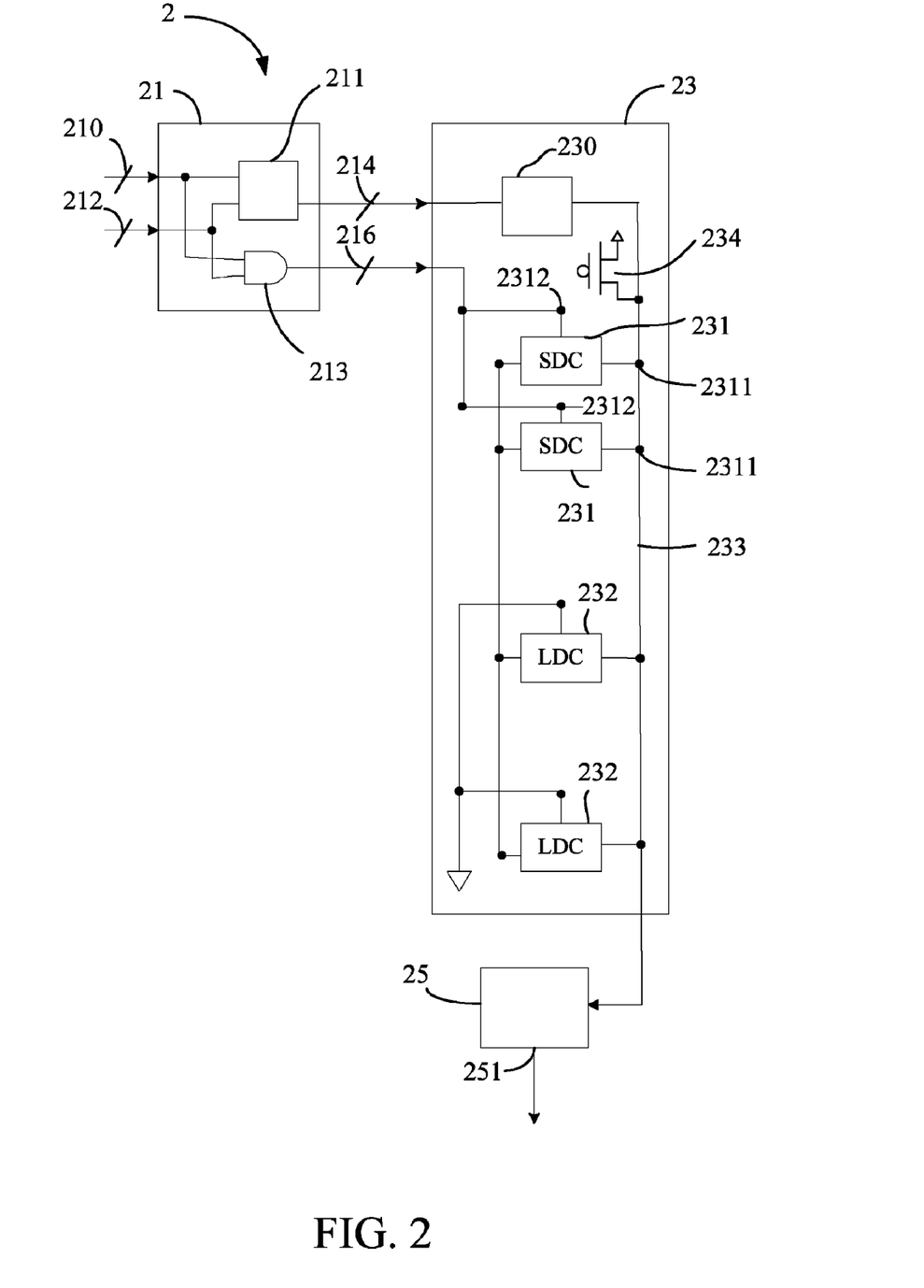
FIG. 2 is a schematic view of a dual mode accessing signal control apparatus.

The preferred embodiment of this invention is depicted in FIG. 2, which is a schematic view of a dual mode accessing signal control apparatus for a memory. The dual mode accessing signal control apparatus 21 generates a signal to a dummy column 23 of the memory. The dummy column 23 comprises a dummy cells set, a write buffer 230 and a precharger 234. The dummy cells set comprises a plurality of dummy cells, including a plurality of source dummy cells 231 and a plurality of load dummy cells 232. The dual mode accessing signal control apparatus 21 comprises a write delay circuit 211 and an activating circuit 213 for use in the write process and the read process of the memory respectively. The operations of which will be described as follows.

Figure 3:
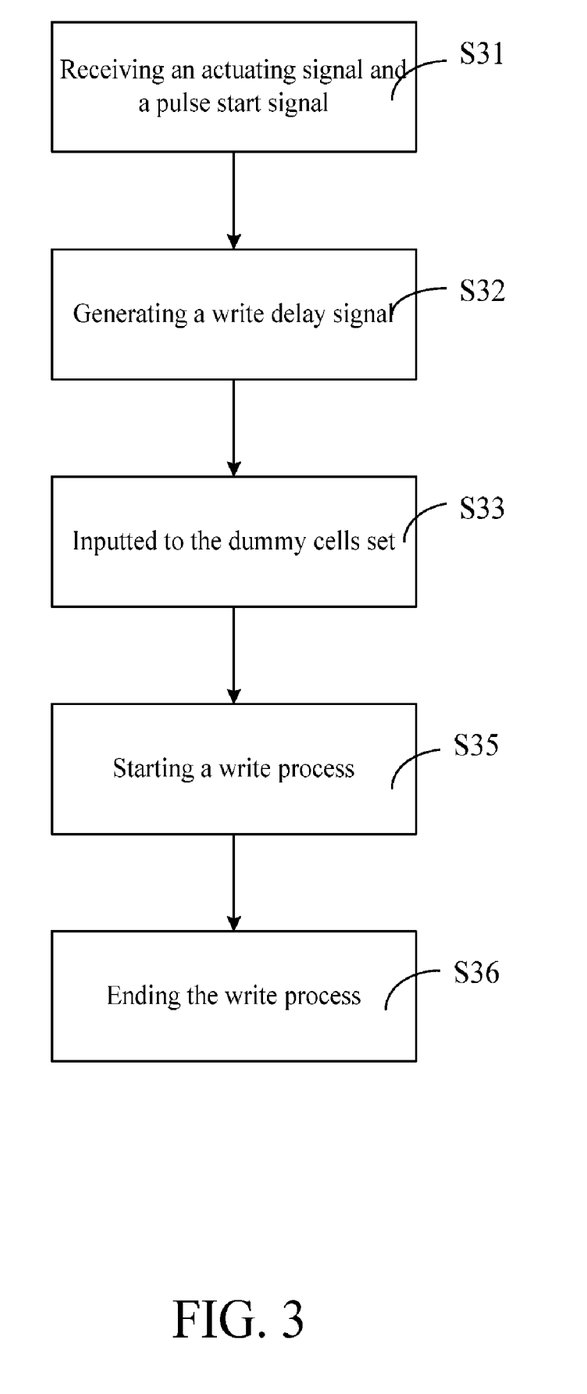
FIG. 3 is a flowchart of the write process of a memory using this invention.

FIG. 3 illustrates the flowchart of the write process of a memory using this invention. The write delay circuit 211 may execute the write process according to a procedure comprising the following steps. Initially in step S31, an actuating signal 210 and a pulse start signal 212 are received. In step S32, the write delay circuit 211 generates a write delay signal 214 when the pulse start signal 212 enables the memory to transit to an accessible state and the actuating signal 210 enables the memory to transit to a writable state. In step S33, after the write delay signal 214 is inputted to the dummy cells set, the write buffer 230 is activated to enable the dummy cells set to generate a first voltage decrease. In step S35, when the first voltage decreases is lower than a reference value, the memory starts the write process. For example, in an SRAM memory, the reference value may be set as a write margin, i.e., a minimum voltage difference between a pair of bitlines of the memory required for a next rewrite operation. In step S36, after a first time interval, a first end indication signal is generated to a dual-mode voltage detector 25 which then generates a first end signal to enable the memory to end the write process.

Figure 4:
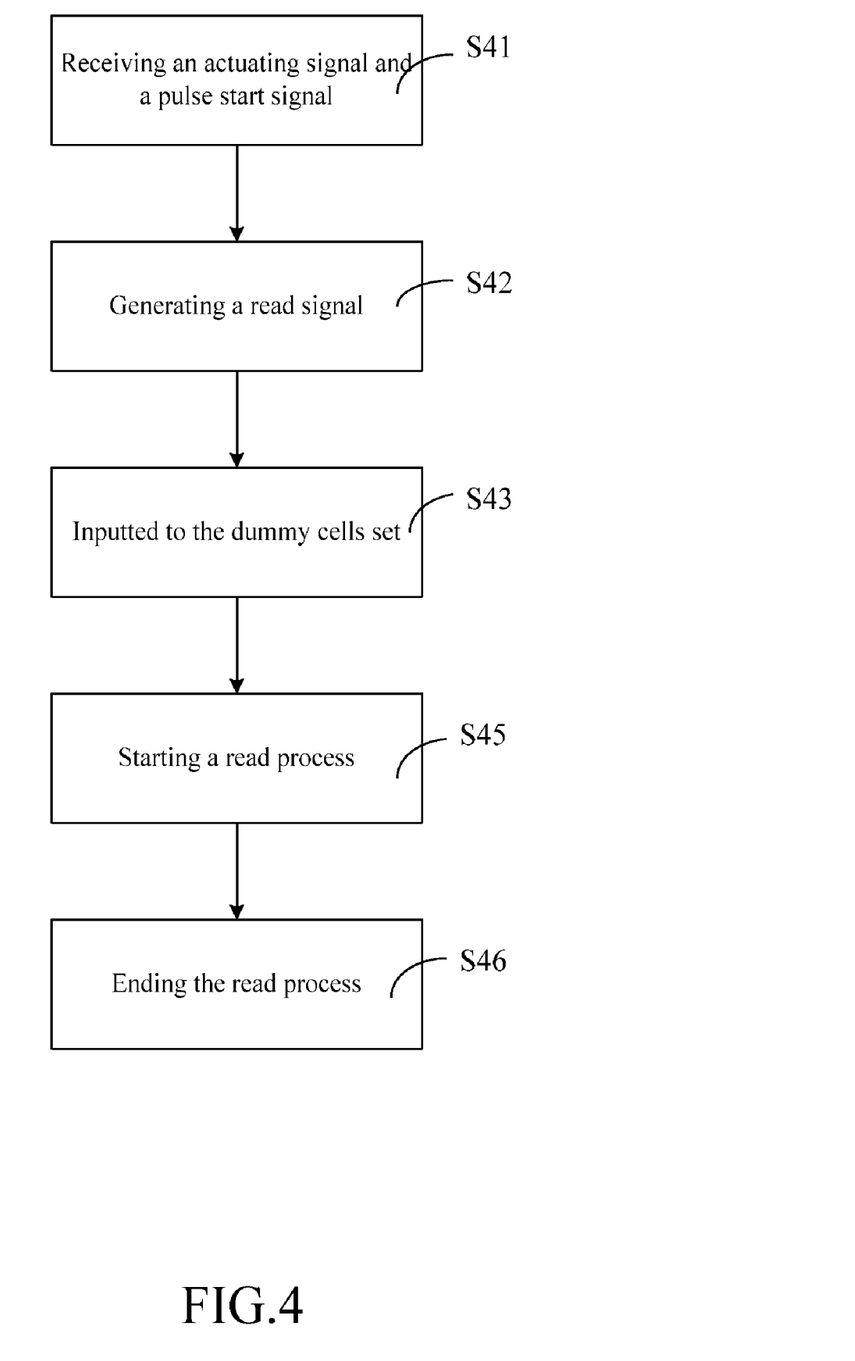
FIG. 4 is a flowchart of the read process of the memory using this invention.

FIG. 4 illustrates a flowchart of the read process of the memory using this invention. In this embodiment, the activating circuit 213 is an AND gate. It should be noted that the AND gate can be replaced by other logic gate in other embodiments. The read process comprises the following steps. In step S41, the actuating signal 210 and the pulse start signal 212 are received. In step S42, a read signal 216 is generated when the pulse start signal 212 enables the memory to transit to an accessible state and the actuating signal 210 enables the memory to transit to a readable state. In step S43, after the read signal 216 is inputted to the dummy cells set, the source dummy cells 231 are activated so that the dummy bitlines 233 begin to be discharged to cause a second voltage decrease. In step S45, once the second voltage decrease is lower than the reference value, the memory starts the read process. For example, in an SRAM memory, the reference value may be set as a preset detection margin of the dual-mode voltage detector 25, i.e., a lower limit of the second voltage decrease at which the read process can be started. In step S46, after a second time interval, a second end indication signal is generated to a dual-mode voltage detector 25 which then generates a second end signal to enable the memory to end the read process.

For purposes of describing the application of the above embodiment, the aforesaid accessible state is at a high level, the readable state is at a low level, and the read signal generated by the activating circuit is at a low level for enabling the dummy cells to generate a decrease in the second voltage. However, those skilled in the art may appreciate that the high level and the low level only represent a relative relationship but are not intended to limit this invention, and upon understanding this invention, they may also make alterations on such a relative relationship according to the design of the circuit hardware, e.g., by using different types of cells or dummy cells.

Hereinafter, the operations of the circuits will be described in detail, and the steps of the write process and the read process will not be described again in the following embodiments.

In reference to FIG. 2, the dummy column 23 comprises a dummy cells set, a write buffer 230 and a precharger 234. The dummy cells set comprises a plurality of dummy cells, including a plurality of source dummy cells 231 and a plurality of load dummy cells 232 adapted for use as loads of the source dummy cells 231. During the write process, after the write buffer 230 receives the write delay signal 214, a first voltage decrease is generated on a dummy bitline 233 coupled to a first electrode 2311 of each of the source dummy cells 231. After the first voltage decrease lasts for a first time interval, the precharger 234 coupled to the dummy bitline 233 recharges the first voltage decrease back to the original voltage level. In this embodiment, the precharger 234 is a P-type metal-oxide semiconductor field effect transistor (MOSFET). During the read process, after a second electrode 2312 of each of the source dummy cells 231 receives a read signal 216, each of the source dummy cells 231 is activated to generate a second voltage decrease on the dummy bitline 233. Likewise, after the second voltage decrease lasts for a second time interval, the precharger 234 recharges the second voltage decrease back to the original voltage level.

The dual-mode voltage detector 25 has an input thereof coupled to the dummy bitline 233. During the write process, the dual-mode voltage detector 25 detects the first voltage decrease on the dummy bitline 233. Once the first voltage decrease becomes lower than the reference value, the memory starts a write process and, after elapse of the first time interval, the first end signal is generated at the output 251 of the dual-mode voltage detector 25 to enable the memory to end the write process. During the read process, the dual-mode voltage detector 25 detects the second voltage decrease on the dummy bitline 233. Once the second voltage decrease becomes lower than the reference value, the memory starts the read process and, after elapse of the second time interval, a second end signal is generated at the output 251 of the dual-mode voltage detector 25 to enable the memory to end the read process. The dual-mode voltage detector 25 may also be a dual-value voltage detector, which is configured to make the memory start the write process and the read process in response to the first voltage decrease and the second voltage decrease respectively and also to generate the first end signal and the second end signal respectively.

Figure 5:
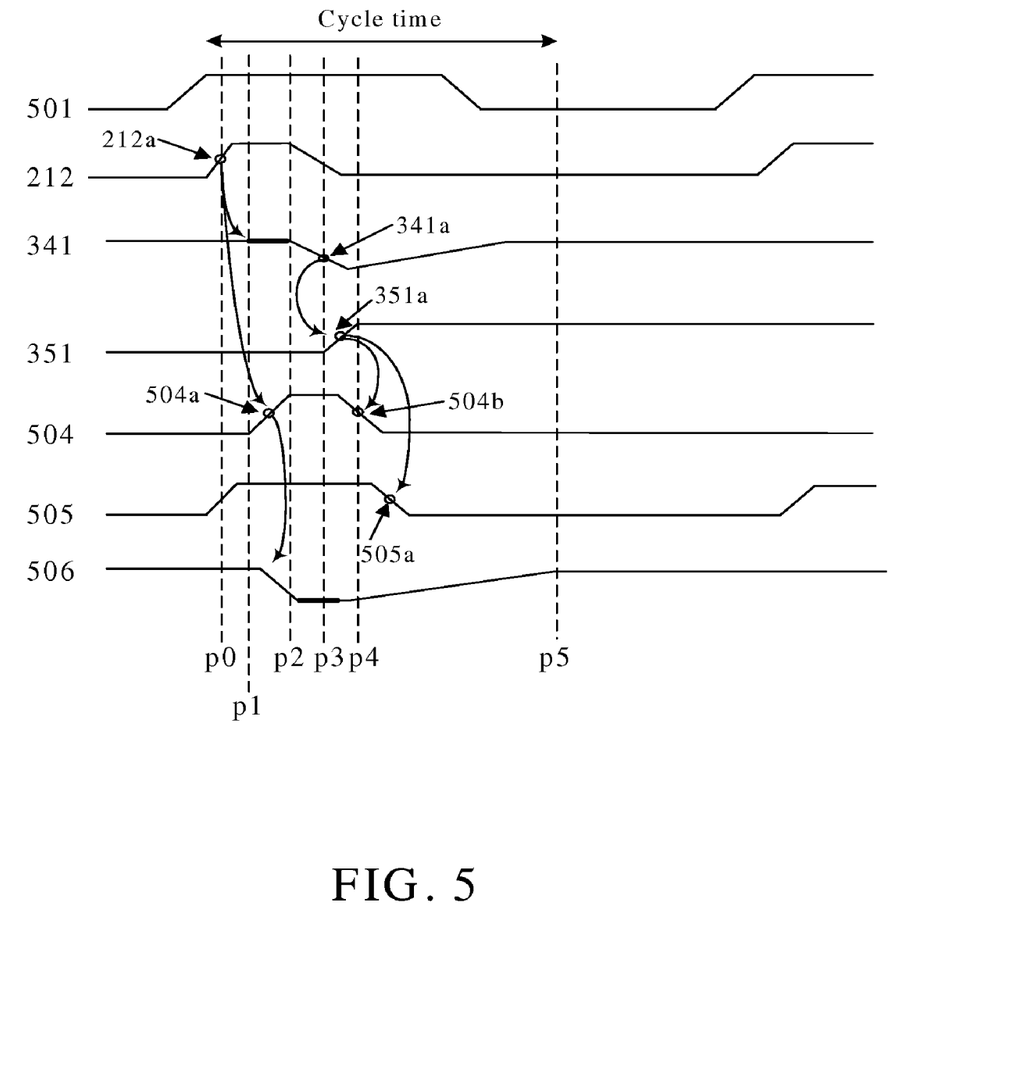
FIG. 5 depicts waveforms of various signals during the write process of the memory using this invention.
Figure 6:
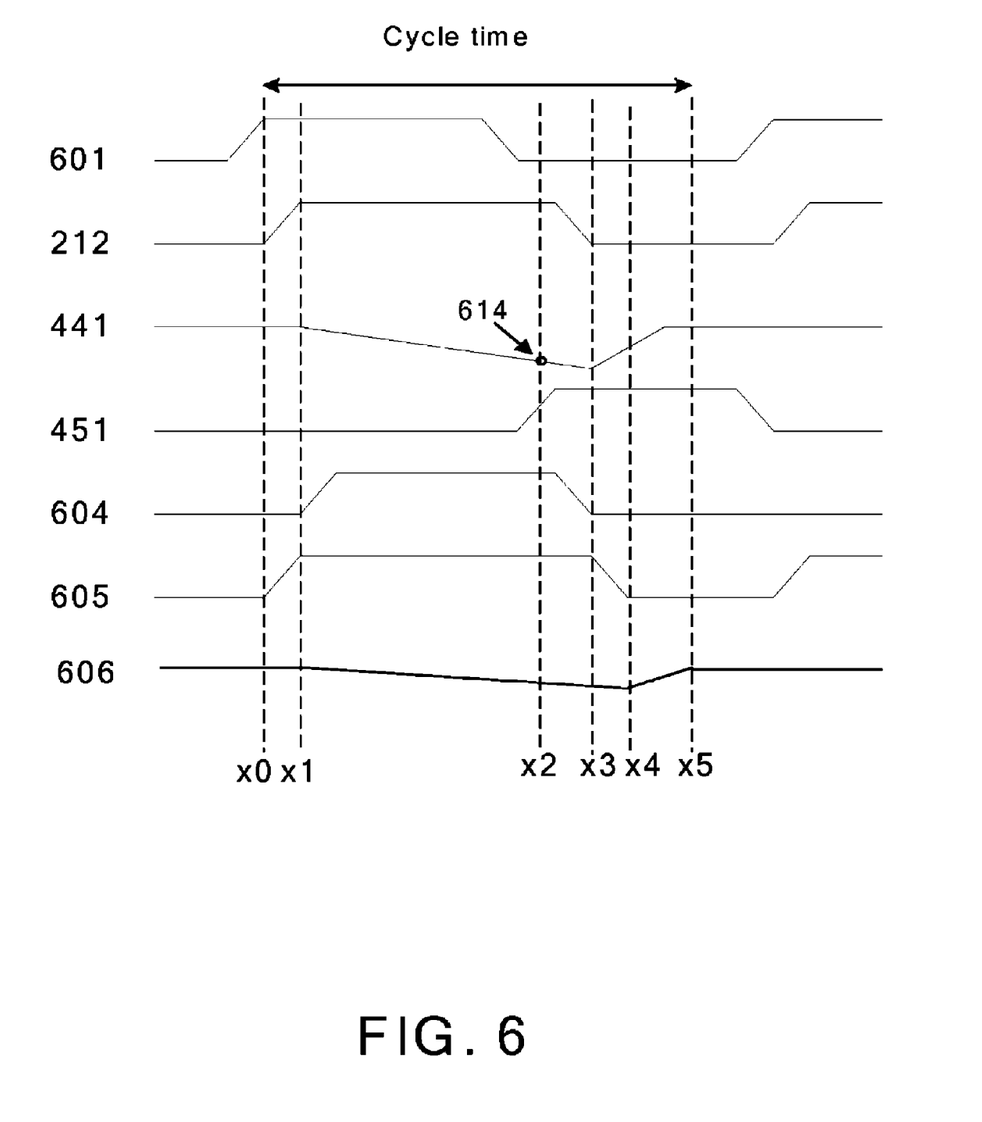
FIG. 6 depicts waveforms of various signals during the read process of the memory using this invention.

For better understanding of the relative relationships among the aforesaid signals, references may be made to FIGS. 5 and 6, which depict waveforms of individual signals during the write process and the read process respectively.

Figure 7:
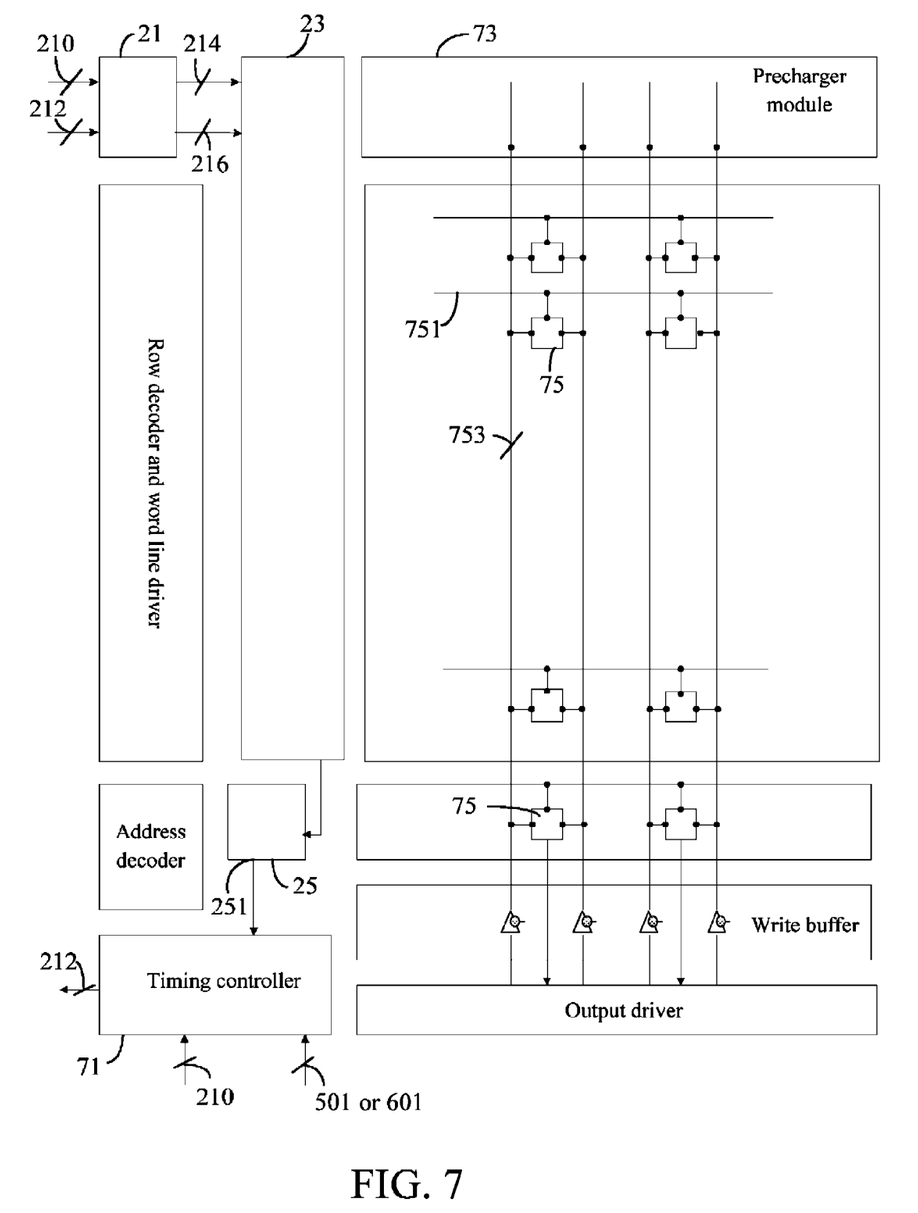
FIG. 7 is a schematic view of a memory comprising a dual mode timing signal generating apparatus of this invention.

FIG. 7 illustrates a schematic view of a memory using the dual mode timing signal generating apparatus 2 of this invention. For some circuit blocks that are not essentially related to the following description, the designations thereof are labeled in FIG. 1a directly for ease of understanding.

FIG. 5 illustrates a schematic view of the waveforms of individual signals involved when the dual mode timing signal generating apparatus 2 executes the write process. The corresponding relationships among the signals are denoted by arrows and described as follows. During the write process of the dual mode timing signal generating apparatus 2, when a clock signal 501 from the outside is inputted to an input 711 of a timing controller 71, the timing controller 71 will be triggered to generate a pulse start signal 212 if the actuating signal 210 also transits to a writable state. At time p0, the pulse start signal 212 rises to about one half of the amplitude (i.e., the position 212a), at which point a first voltage decrease 341 with a delay is generated on the dummy bitline 233 and a wordline signal 504 on the wordline 751 corresponding to the memory cell 75 begins to rise. The aforesaid delay of the first voltage decrease 341 is denoted by a bold solid line between time P1 and P2. When the wordline signal 504 begins to rise, this means that the write process commences. At this point, in response to rise of the wordline signal 504 to about one half of the amplitude (i.e., the position 504a), the bitline signal 506 on the bitline 753 corresponding to the memory cell 75 begins to fall.

Furthermore, subsequent to the delay, the first voltage decrease 341 begins to fall, and when it falls to the position 341a (i.e., time p3), the dual-mode voltage detector 25 is triggered to output the first end signal 351 which then begins to rise. When the first end signal 351 rises to the position 351a, it triggers the wordline signal 504 to fall to prepare for the end of the write process. At time p4 when the wordline signal 504 falls to the position 504b, the write process is completed. When the first end signal 351 rises to the position 351a, it also triggers the precharging signal 505 to fall and the bitline signal 506 to rise to gradually return to the original voltage level at time p5. The aforesaid operations are applicable to memories with a self-timing function.

Furthermore, the interval between the positions 504a and 504b is just the width of the wordline signal 504. Compared to the prior art, this invention has a shorter wordline signal width during the write process, so the bitline signal 506 can begin to rise earlier to result in a shorter SRAM cycle time.

Next, in reference to FIG. 6, during the read process of the dual mode timing signal generating apparatus 2, when a clock signal 601 from the outside is inputted to an input 711 of the timing controller 71 at time x0, the timing controller 71 will be triggered to generate a pulse start signal 212 if the actuating signal 210 also transits to a readable state. The pulse start signal 212 reaches the maximum voltage level at time x1 and then begins to fall at time x2. It should be noted that during the interval between time x1 and time x2, the wordline signal 604 also indicates that the memory starts the read process, and the dual mode accessing signal control apparatus 21 generates a read signal 216 to the dummy column 23 so that the dummy cells set in the dummy column 23 begins at time x2 to generate a second voltage decrease 441 on the dummy bitline 233. When the second voltage decrease 441 becomes lower than the reference value 614 (e.g., the aforesaid detection margin), the memory begins to end the read process. At time x3, the dual-mode voltage detector 25 outputs a second end signal 451 to the timing controller 71 so that the memory will end the read process.

Furthermore, for the memory cell 75 of the memory, when the second end signal 451 begins to rise gradually around time x2, a wordline signal 604 of a high level exists on the wordline 751. Thereafter, in response to the second end signal 451, the wordline signal 604 begins to fall from time x2 to end the read process. Once the second end signal 451 transits gradually to a high level, the precharging signal 605 begins to discharge so that the bitline signal 606 will begin to rise.

It should be particularly noted that the rising and falling of the signal waveforms depicted in FIGS. 5 and 6 are only for purposes of illustrating the timing relationships among the signals of this invention, and the characteristics of the rising and falling waveforms such as the slope are not intended to limit the scope of this invention. Upon understanding this invention, those skilled in the art may modify the waveforms of these signals without departing from the scope of this invention.

From the description of the above embodiments, the following advantages can be summarized. First, this invention can be used for a memory with only one dummy column 23 and can execute the write process and the read process of the memory on a dummy bitline 233 of the dummy column 23 to accomplish the self-timing function of executing the write process and the read process in the dummy column 23. Second, because this invention requires only a single column 23 and a dual-mode voltage detector 25, this not only saves the use of the chip area, but also makes it easier for the timing controller to control the write and the read operations due to inconsistent discharging time of the bitlines of multiple memory cells incurred by different temperatures and voltages. Third, by generating a shorter wordline signal width, the bitline signal can begin to rise earlier to result in a shorter SRAM cycle time. Because random read process and write process are substantially interleaved during the operation of the SRAM, the cycle time of random accessing operations of the memory can be shortened on average. Fourth, the write delay circuit 211 provides an adjustable delay time on write delay signal for various process conditions.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A dual mode accessing signal control apparatus for use in a dummy cells set of a memory comprising a plurality of dummy cells, the dual mode accessing signal control apparatus comprising:
    a write delay circuit, being configured to receive an actuating signal and a pulse start signal and generate a write delay signal to the dummy cells set after the pulse start signal is transited to an accessible state and the actuating signal is transited to a writable state;
    an activating circuit, being configured to receive the actuating signal and the pulse start signal and generate a read signal to the dummy cells set after the pulse start signal is transited to an accessible state and the actuating signal is transited to a readable state;
    wherein the write delay signal is adapted to make the dummy cells set generate a first voltage decrease to induce the memory to start a write process and the write delay signal is adapted to make the dummy cells set generate a first end indication signal after a first time interval to induce the memory to end the write process; the read signal is adapted to make the dummy cells set generate a second voltage decrease to induce the memory to start a read process and the read signal is adapted to make the dummy cells set generate a second end indication signal after a second time interval to induce the memory to end the read process.

2. The dual mode accessing signal control apparatus as claimed in claim 1, wherein the write delay signal is adapted to make the dummy cells set generate the first voltage decrease lower than a reference value to induce the memory to start the write process.

3. The dual mode accessing signal control apparatus as claimed in claim 1, wherein the read signal is adapted to make the dummy cells set generate the second voltage decrease lower than a reference value to induce the memory to start the read process.

4. The dual mode accessing signal control apparatus as claimed in claim 1, wherein the activating circuit is a logic gate, the accessible state is a high voltage level, the readable state is a low voltage level, and the read signal generated by the activating circuit is a low voltage level and is adapted to make the dummy cells set generate the second voltage decrease.

5. The dual mode accessing signal control apparatus as claimed in claim 4, wherein the activating circuit is a AND gate.

6. The dual mode timing signal generating apparatus as claimed in claim 1, wherein the write delay circuit is further configured to add an adjustable delay time between the pulse start signal and the write delay signal.

7. A dual mode timing signal generating apparatus for use in a memory, the dual mode timing signal generating apparatus comprising:
    a dual mode accessing signal control apparatus, being configured to receive an actuating signal and a pulse start signal and generate a write delay signal and a read signal in response to the reception of the actuating signal and the pulse start signal, respectively;
    a dummy column, being configured to generate a first voltage decrease and a second voltage decrease in response to reception of the write delay signal and the read signal, respectively; and
    a dual-mode voltage detector, being configured to make the memory start a write process in response to the first voltage decrease and generate a first end signal to induce the memory to end the write process after a first time interval; and the dual-mode voltage detector being configured to make the memory start a read process in response to second voltage decrease and generate a second end signal to induce the memory to end the read process after a second time interval.

8. The dual mode timing signal generating apparatus as claimed in claim 7, wherein the dummy column comprises:
    a write buffer, being configured to receive the write delay signal and generate the first voltage decrease at a dummy bitline; and a dummy cells set, being configured to receive the write delay signal and generate the first voltage decrease at the dummy bitline, wherein the dummy bitline is coupled to the dual-mode voltage detector at an input terminal thereof to make the dual-mode voltage detector start the write process in response to the first voltage decrease.

9. The dual mode timing signal generating apparatus as claimed in claim 8, wherein the write delay signal is adapted to make the dummy cells set generate the first voltage decrease lower than a reference value to induce the memory to start the write process.

10. The dual mode timing signal generating apparatus as claimed in claim 7, wherein the dummy column comprises:
   a dummy cells set, being configured to receive the read signal and generate the second voltage decrease at a dummy bitline, wherein the dummy bitline is coupled to the dual-mode voltage detector at an input terminal thereof and to make the dual-mode voltage detector start the read process in response to the second voltage decrease.

11. The dual mode timing signal generating apparatus as claimed in claim 10, wherein the read signal is adapted to make the dummy cells set generate the second voltage decrease lower than a reference value to induce the memory to start the read process.

12. The dual mode timing signal generating apparatus as claimed in claim 10, wherein the dummy cells set comprises:
   a plurality of source dummy cells (SDCs), being configured to receive the read signal and generate the second voltage decrease at the dummy bitline; and
   a plurality of load dummy cells (LDCs), being configured to be loads of the dummy cells, wherein the dummy bitline is coupled to each of the LDCs at one terminal thereof.

13. The dual mode timing signal generating apparatus as claimed in claim 8, wherein the dummy column further comprises a precharger coupled to the dummy bitline, the precharger is configured to charge the dummy bitline after the end of one of the write process and the read process.

14. The dual mode timing signal generating apparatus as claimed in claim 13, wherein the precharger is a P-type MOS-FET.

15. The dual mode timing signal generating apparatus as claimed in claim 10, wherein the dummy column further comprises a precharger coupled to the dummy bitline, the precharger is configured to charge the dummy bitline after the end of one of the write process and the read process.

16. The dual mode timing signal generating apparatus as claimed in claim 15, wherein the precharger is a P-type MOS-FET.

17. The dual mode timing signal generating apparatus as claimed in claim 7, wherein the dual-mode voltage detector is a dual-value voltage detector being configured to make the memory start the write process and the read process in response to the first voltage decrease and the second voltage decrease respectively, and generate the first end signal and the second end signal respectively.

\* \* \* \* \*